(12) United States Patent
Tonomura et al.

(10) Patent No.: US 8,223,536 B2
(45) Date of Patent: Jul. 17, 2012

(54) SEMICONDUCTOR MEMORY DEVICE

(75) Inventors: Yasuko Tonomura, Tokyo (JP); Shuichi Tsukada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 141 days.

(21) Appl. No.: 12/882,803

(22) Filed: Sep. 15, 2010

(65) Prior Publication Data

US 2011/0063890 A1    Mar. 17, 2011

(30) Foreign Application Priority Data

Sep. 17, 2009    (JP) ................................ 2009-215780

(51) Int. Cl.
*G11C 11/00*    (2006.01)
(52) U.S. Cl. ....................................... 365/163; 365/148
(58) Field of Classification Search .................. 365/163, 365/148, 189.09
See application file for complete search history.

(56) References Cited

U.S. PATENT DOCUMENTS

| 8,018,763 | B2 * | 9/2011 | Fackenthal et al. | 365/163 |
| 8,040,715 | B2 * | 10/2011 | Takase | 365/148 |
| 2007/0014150 | A1 | 1/2007 | Cho et al. | |
| 2007/0058425 | A1 * | 3/2007 | Cho et al. | 365/163 |

FOREIGN PATENT DOCUMENTS

JP    2007-26644    2/2007

* cited by examiner

*Primary Examiner* — Anh Phung
(74) *Attorney, Agent, or Firm* — Morrison & Foerster LLP

(57) ABSTRACT

A semiconductor memory device comprises: a phase change element (RP) and a memory cell transistor (MN0) that controls writing and reading of data with respect to the phase change element (RP); the memory cell transistor (MN0) supplies a current to the phase change element (RP) based on a first potential (VPS) in a first (read) operation mode, and in a second (write) operation mode supplies a current based on the first potential (VPS), and subsequently supplies a current based on a second potential (VPP) higher than the first potential (VPS). In a write operation, consumed current is reduced.

7 Claims, 10 Drawing Sheets

US 8,223,536 B2

SEMICONDUCTOR MEMORY DEVICE

REFERENCE TO RELATED APPLICATION

This application is based upon and claims the benefit of the priority of Japanese patent application No. 2009-215780, filed on Sep. 17, 2009, the disclosure of which is incorporated herein in its entirety by reference thereto.

TECHNICAL FIELD

The present invention relates to a semiconductor memory device, and in particular to a semiconductor memory device provided with a resistance change memory.

BACKGROUND

As an example of a resistance change memory, a phase change memory is an element that uses a property of transitioning between an amorphous state and a crystalline state by adding heat electrically generated to a chalcogenide type material (Ge, Sb, Te), to perform storage. In a cell formed by a phase change memory, in a case of starting a phase change by Joule heat by electrical current to perform writing, as shown in FIG. 10, when there is a transition from a low resistance state (set state, crystalline state) to a high resistance state (reset state, amorphous state), a large current is flowed for a short time. Conversely in a case of transitioning from a high resistance state (reset state, amorphous state) to a low resistance state (set state, crystalline state), it is necessary to flow a comparatively low current for a long time. In this regard, in a case of performing reading, as shown in FIG. 10, it is sufficient to flow a smaller current compared to a case of writing.

A phase change memory device performing writing and reading as described above is disclosed in Patent Document 1. This phase change memory device is provided with a phase change memory that includes a plurality of memory cells; a write step-up circuit that, in a first operation mode (a write operation mode), responds to a control signal (a write active signal) to step-up a first voltage (power supply voltage), to be outputted as a first control voltage (a voltage that is sufficiently high in order to start a phase change in a selected memory cell), and in a second operation mode (a read operation mode) or a third operation mode (standby mode), responds to a control signal to step-up the first voltage, to be outputted as a second control voltage (a voltage that is lower than the first control voltage, and higher than the first voltage); and a write driver that, in the first operation mode, is driven by the first control voltage and writes data to the selected memory cell. It is to be noted that, as the step-up circuit, a charge pump circuit using a capacitive element is generally used.

[Patent Document 1]
JP Patent Kokai (laid-open) Publication No. JP-P2007-26644A

SUMMARY

The entire disclosure of Patent Document 1 is incorporated herein by reference thereto. The following analysis is given by the present invention.

A step-up circuit may be used in order to generate a high power supply voltage that is required for a phase change memory. However, the lower an external power supply voltage connected to the step-up circuit is, and the higher the required voltage is, the more it is necessary to increase the number of stepping-up stages in the step-up circuit, that is, the number of capacitive elements used in a charge-pump circuit of a multi-stage configuration, composing the step-up circuit. Increasing the number of capacitive elements results in an increase in the amount of consumed current necessary for performing voltage stepping-up. For example, according to an investigation by the inventors of the present invention, current conversion efficiency, when capacitive elements are used in 2 stages with regard to a prescribed external power supply voltage, is approximately 45%, while on the other hand, when capacitive elements are used in 3 stages, the current conversion efficiency is approximately 28%. Here, the current conversion efficiency is expressed as being equal to: (current from step-up voltage to load circuit)/(current supplied to step-up voltage circuit). That is, when the capacitive elements are used in 3 stages, the remaining 72% is consumed in a switching element or the like in order to step-up voltage. Therefore, in order to reduce current consumed by a semiconductor memory device, there is a problem in reducing current consumed in a step-up circuit with many stepping-up stages, with regard to a writing operation.

Accordingly, in order to reduce current consumed by a semiconductor memory device, the inventors of the present invention considered that, with regard to a writing operation, lightening a load in a step-up circuit having many stepping-up stages (reducing current supply amount) is desirable, and arrived at the present invention.

According to a first aspect of the present invention, a semiconductor memory device is provided with a resistance change element, and a memory cell transistor that controls writing data to and reading from the resistance change element, wherein the memory cell transistor supplies a current based on a first potential in a first operation mode, to the resistance change element, and in a second operation mode supplies a current based on the first potential followed by subsequently supplying a current based on a second potential higher than the first potential.

According to a second aspect, there is provided a semiconductor device comprising: a first voltage generator supplied with a first voltage, pumping the first voltage to generate a second voltage; a second voltage generator supplied with the first voltage, pumping the first voltage to generate a third voltage that is larger than the second voltage, and the second voltage generator being larger in number of pumping than the first voltage generator; a word line; a memory cell unit including a memory cell transistor of which a control electrode is connected to the word line and a memory cell coupled to the memory cell transistor; and a word line control circuit coupled to the first and second voltage generators and the word line, the word line control circuit supplying the word line with the third voltage after supplying the word line with the second voltage in series.

According to a third aspect, there is provided a method comprising: pumping a first voltage to generate a second voltage larger in absolute value than the first voltage; pumping the first voltage to generate a third voltage larger in absolute value than the second voltage; supplying a word line with the second voltage, and then supplying the word line with the third voltage in series.

The meritorious effects of the present invention are summarized as follows. According to the present invention, it is possible to reduce consumed current in a second operation mode (write operation).

PREFERRED MODES

Figure 1:
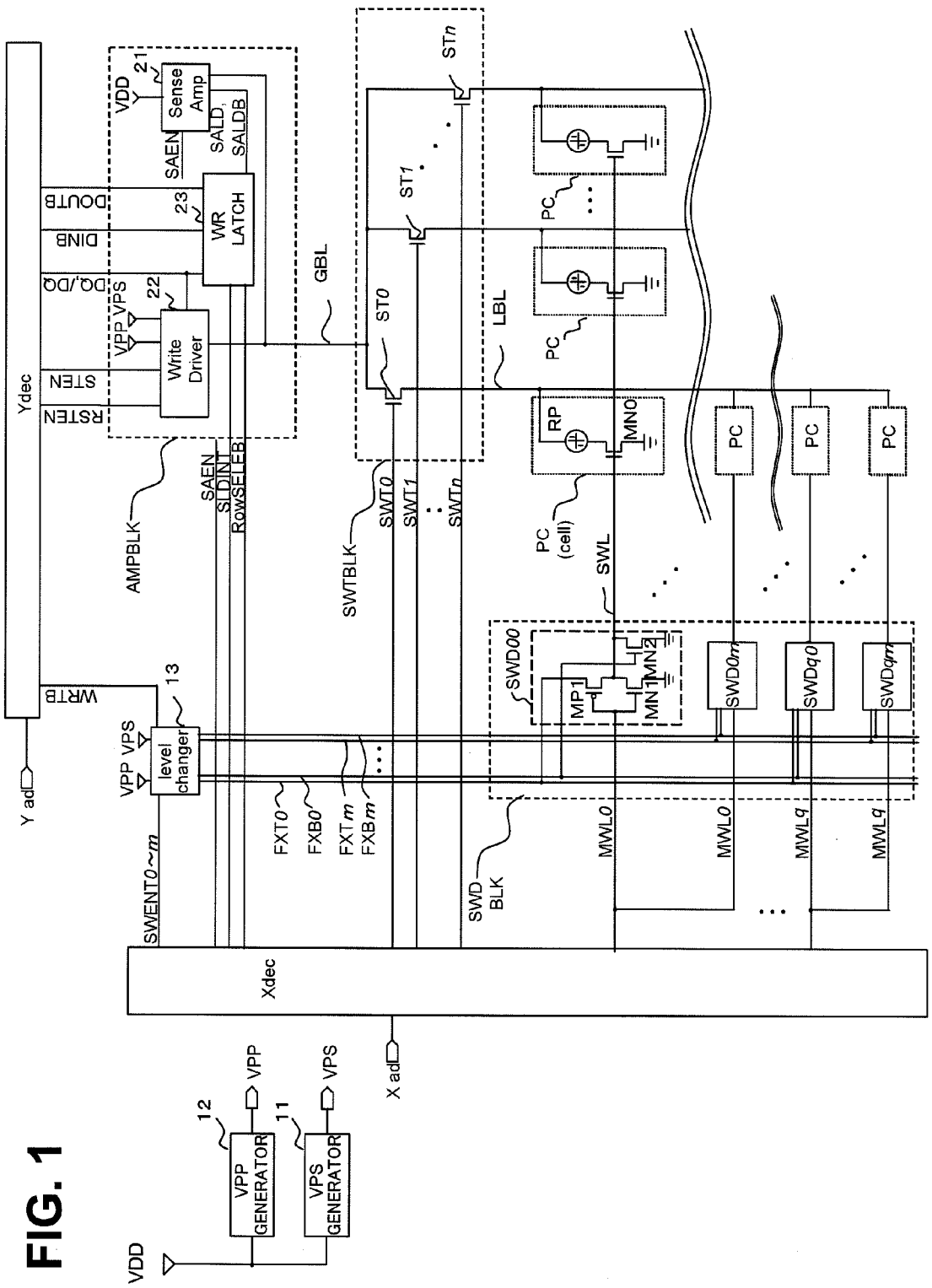
FIG. 1 is a circuit diagram representing main parts of a semiconductor memory device according to an exemplary embodiment of the present invention.

A semiconductor memory device according to an exemplary embodiment of the present invention is provided with a resistance change element (corresponding to RP in FIG. 1), and a memory cell transistor (MN0 in FIG. 1) that controls writing data to and reading data from the resistance change element, wherein the memory cell transistor supplies a current based on a first potential (VPS in FIG. 1) when in a first operation mode (read operation mode) to the resistance change element, and when in a second operation mode (write operation mode) supplies a current based on the first potential and subsequently supplies a current based on a second potential (VPP in FIG. 1) that is higher than the first potential.

The semiconductor memory device may be configured by a memory cell array composed of memory cell (PC in FIG. 1) units in each of which the resistance change element and the memory cell transistor are serially connected, the memory cells being arranged in a matrix; a bit line (LBL or the like, in FIG. 1) that commonly connects ends of the plural memory cells in a column direction of the memory cell array; a word line (SWL or the like, in FIG. 1) that commonly connects gates of the plural memory cell transistors in a row direction of the memory cell array; a write driver (corresponding to 22 in FIG. 1) that drives the bit line; a word line driver (corresponding to SWDBLK in FIG. 1) that drives the word line; and first and second step-up circuits (corresponding to 11 and 12 in FIG. 1) that form respective supply sources of first and second potentials.

In the semiconductor memory device, the first and second step-up circuits may be formed of a charge-pump circuit of a multi-stage configuration, respectively, and the second step-up circuit may have a larger number of stepping-up stages than the first step-up circuit.

In the semiconductor memory device, the second operation mode may be a write mode, and when in the write mode the write driver may drive the bit line at the first potential in a case where writing is performed in a first state with regard to the resistance change element, and may drive the bit line at the second potential in a case where writing is performed in a second state with regard to the resistance change element.

In the semiconductor memory device, a time-period of bit line driving at the first potential may be longer than a time-period of bit line driving at the second potential.

In the semiconductor memory device, in the resistance change element, the first and second states may respectively be a low resistance state and a high resistance state.

In the semiconductor memory device, the resistance change element may include a material that changes phase between the first and the second state, and may be programmed such that the phase change material in the first state is in a crystalline state, and in the second state is in an amorphous state.

In the semiconductor memory device, when in the write mode, the word line driver may be activated by an active command, and the write driver may be activated by a succeeding write command.

According to the semiconductor memory device as described above, particular advantage is achieved which includes at least as follows. When a potential level of a memory cell transistor gate is stepped-up to the second potential (VPP), which is a high stepped-up voltage, stepping-up occurs to VPP from a state not stepped-up from ground level (VSS) that is a potential level when the gate is not activated, but from a state stepped-up to the first potential (VPS) that is a potential level lower than VPP and higher than VSS. Therefore, it is possible to lighten the load of the step-up circuit (the second step-up circuit) at VPP, having a low current conversion efficiency, to reduce consumed current in the semiconductor memory device.

It is noted that in the aforementioned description of the preferred modes the symbols or numerals referencing the drawings are mentioned only for better illustration aiming at helping understanding, and not intended as limitative. A detailed description is given below by way of exemplary embodiments, making reference to the drawings.

First Exemplary Embodiment

FIG. 1 is a circuit diagram representing main parts of a semiconductor memory device according to an exemplary embodiment of the present invention. In FIG. 1, the semiconductor memory device is provided with a VPS generator 11, a VPP generator 12, an X decoder Xdec, a Y decoder Ydec, a sub-word unit SWDBLK, a level shift circuit 13, an amplifier unit AMPBLK, a switch unit SWTBLK, and a memory cell PC. Memory cells PC are arranged in a matrix at respective intersections of a local bit line LBL driven by the switch unit SWTBLK and a sub-word line SWL driven by the sub-word unit SWDBLK.

Figure 2A:
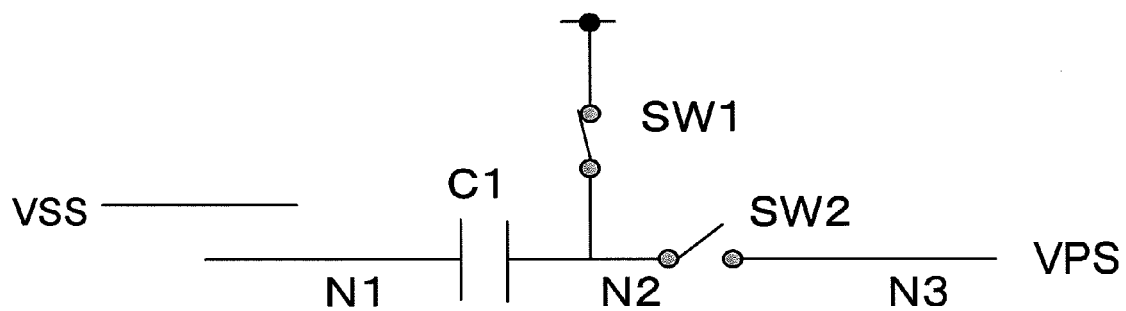
FIGS. 2A and 2B are circuit diagrams of an example of a VPS generator.
Figure 2B:
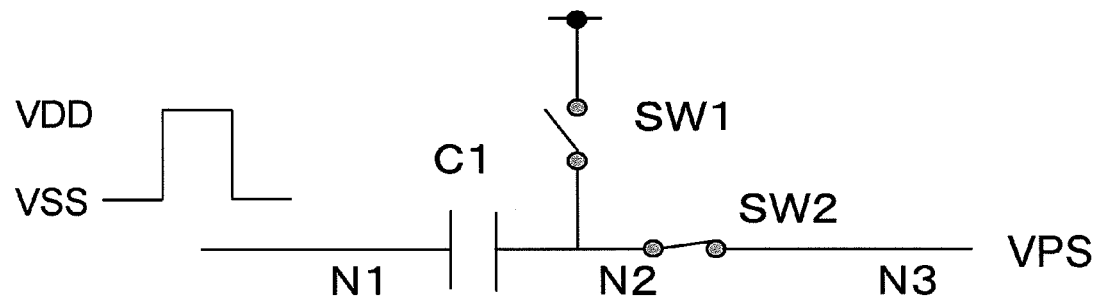

FIGS. 2A and 2B are circuit diagrams of the VPS generator. The VPS generator 11 is a step-up circuit, stepped-up by a charge pump of a 2 stage configuration provided with a capacitive element C1 and switch elements SW1 and SW2. The capacitive element C1 has a first end connected to an input end N1 and a second end connected to a node N2, the switch element SW1 has a first end connected to a power supply VDD and a second end connected to the node N2, and the switch element SW2 has a first end connected to an output end N3 and a second end connected to the node N2.

Here, as shown in FIG. 2A, the switch element SW1 is ON and the switch element SW2 is OFF, and the input end N1 is VSS. In this case, the first end of the capacitive element C1 is at ground potential, and the second end (the node N2) is the power supply VDD. Next, as shown in FIG. 2B, the switch element SW1 is OFF and the switch element SW2 is ON, and the input end N1 is VDD. In this case, the potential of the input end N1 is turned to VDD and since the potential (difference) between the two ends of the capacitive element C1 is maintained as it is, the node N2, that is, the potential of an output end N3, assumes 2×VDD. By alternately repeating connection states shown in FIGS. 2A and 2B, a step-up potential of VPS=2×VDD is obtained at the output end N3.

Figure 3A:
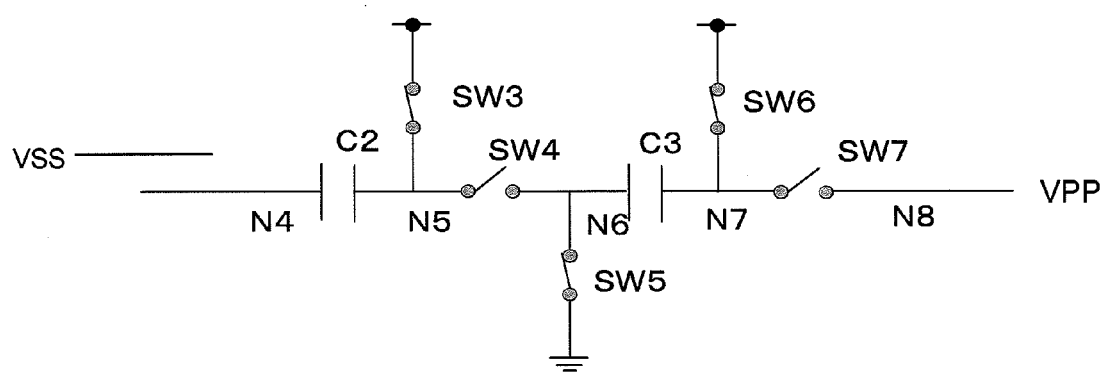
FIGS. 3A and 3B are circuit diagrams of an example of a VPP generator.
Figure 3B:
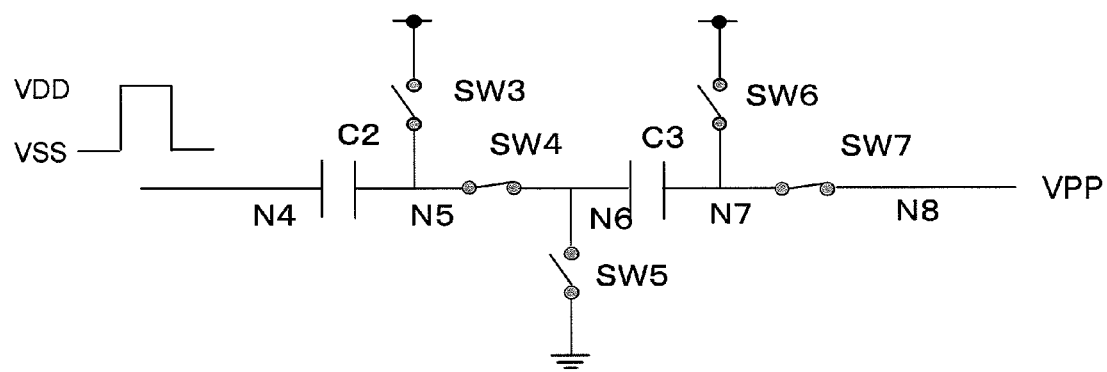

FIGS. 3A and 3B are circuit diagrams of the VPP generator. The VPP generator 12 is a step-up circuit stepped up by a charge pump of a 3 stage configuration provided with capacitive elements C2 and C3, and switch elements SW3 to SW7. The capacitive element C2 has a first end connected to an input end N4 and a second end connected to a node N5, the switch element SW3 has a first end connected to a power supply VDD and a second end connected to the node N5, and the switch element SW4 has a first end connected to the node N5 and a second end connected to a node N6. The switch element SW5 has a first end connected to VSS and a second end connected to the node N6, the capacitive element C3 has a first end connected to an input end N6 and a second end connected to a node N7, the switch element SW6 has a first end connected to the power supply VDD and a second end connected to the node N7, and the switch element SW7 has a first end connected to the node N7 and a second end connected to an output end N8.

Here, as shown in FIG. 3A, the switch elements SW3, SW5, and SW6 are ON, the switch elements SW4 and SW7 are OFF, and the input end N1 is at VSS. In this case, the first end of the capacitive element C2 is at ground potential, and the second end (the node N5) is at the power supply VDD. Furthermore, the first end (the node N6) of the capacitive element C3 is at ground potential, and the second end (the node N7) is at the power supply VDD. Next, as shown in FIG. 3B, the switch elements SW3, SW5, and SW6 are OFF, the switch elements SW4 and SW7 are ON, and the input end N4 is at VDD. In this case, the potential at the input end N4 is VDD and since the potential between the two ends of the capacitive element C2 is maintained as it is, the potential at the nodes N5 and N6 is 2×VDD, and in addition, since the potential between the two ends of the capacitive element C3 is maintained as it is, the node N7, that is, the potential of an output end N8, assumes 3×VDD. By alternately repeating connection states shown in FIGS. 3A and B, a step-up potential of VPP=3×VDD is obtained at the output end N8. Here, with a relationship of VPP>VPS, the number of capacitive elements being used is larger in the VPP generator 12.

In FIG. 1, the X decoder Xdec receives a row address signal Xad as input to be decoded, and outputs a signal SWENTj (j=0 to m) to the level shift circuit (level changer) 13, an activation signal SAEN, a signal SLDINT, and a signal RowSELEB to the amplifier unit AMPBLK, a signal SWTi (i=0 to n) to the switch unit SWTBLK, and a main word line signal MWLi (i=0 to q) to the sub-word unit SWDBLK.

The Y decoder Ydec receives a column address signal Yad as input to be decoded, and outputs a signal WRTB to the level shift circuit 13, a reset signal RSTEN, a set signal STEN, a signal DINB, and a signal DOUTB to the amplifier unit AMPBLK. Furthermore, signals DQ and DQB are received as input from the amplifier unit AMPBLK.

Each memory cell PC includes a phase change element RP and memory cell transistor MN0 that are serially connected, between the local bit line LBL and a ground terminal (ground). The memory cell transistor MN0 has a gate (control electrode) connected to the sub-word line SWL, a source connected to ground, and a drain connected via the phase change element RP to a local bit line LBL.

The sub-word unit SWDBLK is provided with a sub-word line drive circuit SWDij (i=0 to q, j=0 to m). The sub-word line drive circuit SWDij is provided with NMOS transistors MN1 and MN2, and a PMOS transistor MP1. The NMOS transistor MN1 and the PMOS transistor MP1 have a common gate connected to a main word line signal MWLi. The NMOS transistor MN1 has a source connected to ground, and a drain connected to the sub-word line SWL. The PMOS transistor MP1 has a source that is given a sub-word selection line signal FXTj, and a drain connected to the sub-word line SWL. The NMOS transistor MN2 has a source connected to ground, a drain connected to the sub-word line SWL, and a gate that is given a sub-word selection line signal FXBj.

The sub-word unit SWDBLK having this type of configuration receives as input, sub-word selection line signals FXTj (j=0 to m) and FXBj and a main word line signal MWLi (i=0 to q) obtained by decoding a part of a row address signal Xad, and outputs the sub-word line signal SWL. Here, a potential of the sub-word line SWL is controlled by the level shift circuit 13 to be VPP or VPS.

Figure 4:
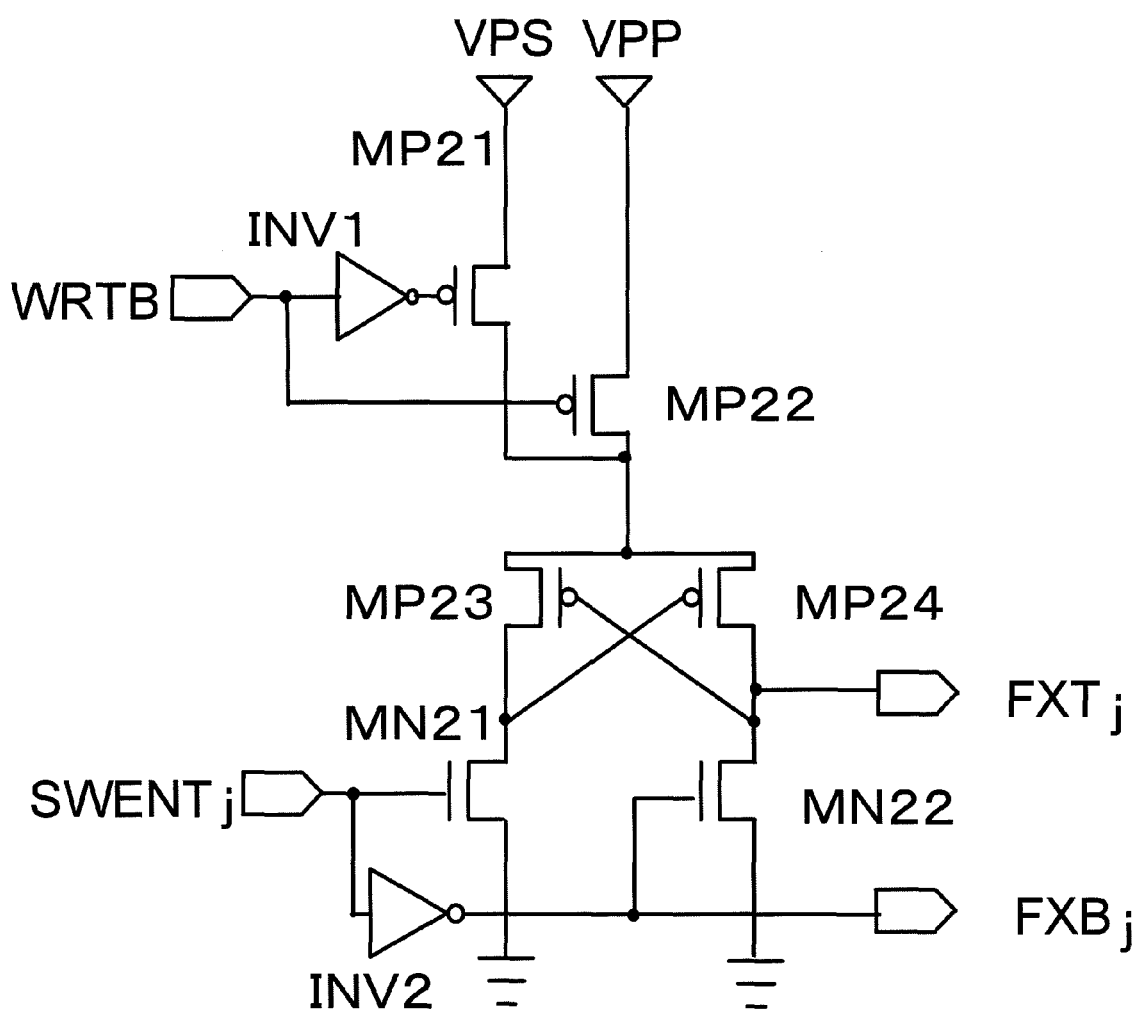
FIG. 4 is a circuit diagram of an example of a level shift circuit.

An example of the level shift circuit 13 is shown in FIG. 4. The level shift circuit 13 is provided with NMOS transistors MN21 and MN22, PMOS transistors MP21 to MP24, and inverter circuits INV1 and INV2. The NMOS transistor MN21 has a source connected to ground, a drain connected to a drain of the PMOS transistor MP23 and a gate of the PMOS transistor MP24, and a gate that is given a signal SWENTj. The NMOS transistor MN22 has a source connected to ground, a drain connected to a drain of the PMOS transistor MP24 and a gate of the PMOS transistor MP23, and a gate that is given a signal obtained by inverting the signal SWENTj by the inverter circuit INV2. The sub-word selection line signal FXBj is outputted as output from the inverter circuit INV2, and the sub-word selection line signal FXTj is outputted from a drain of the PMOS transistor MP24.

The PMOS transistor MP21 has a source connected to VPS, a drain connected to a source of the PMOS transistors MP23 and MP24, and a gate that is given a signal obtained by inverting the signal WRTB by the inverter circuit INV1. The PMOS transistor MP22 has a source connected to VPP, a drain connected to a source of the PMOS transistors MP23 and MP24, and a gate that is given the signal WRTB.

The level shift circuit 13 with this type of configuration outputs the sub-word selection line signals FXTj and FXBj corresponding to the signal SWENTj obtained by decoding a part of the row address signal Xad, to the sub-word unit SWDBLK. The sub-word selection line signal FXTj is given a potential of VPP by the signal WRTB that becomes L when in a write mode, and is given a potential of VPS by the signal WRTB that becomes H when in a read mode.

In FIG. 1, the switch unit SWTBLK is configured by switch elements STi (i=0 to n) for connecting a plurality of local bit lines LBL and a global bit line GBL; a first end of the switch element STi is connected to the global bit line GBL and a second end is connected to the local bit line LBL. Opening and closing of the switch element STi is controlled according to the signal SWTi obtained by decoding a part of the row address signal Xad.

The amplifier unit AMPBLK performs writing/reading of data with regard to the global bit line GBL. The amplifier unit AMPBLK includes a sense amplifier circuit (Sense Amp) 21 that performs reading of read data and amplification, a write driver circuit (Write Driver) 22 that controls write data with regard to the phase change memory, and a write/read latch circuit (WR latch) 23 that holds write/read data of the phase change memory.

The sense amplifier circuit 21 receives the activation signal SAEN and is activated, amplifies data from the global bit line GBL, to be outputted to the write-read latch circuit 23 as signals SALD and SALDB. It is to be noted that the activation signal SAEN is activated in correspondence with the row address signal Xad.

Figure 5:
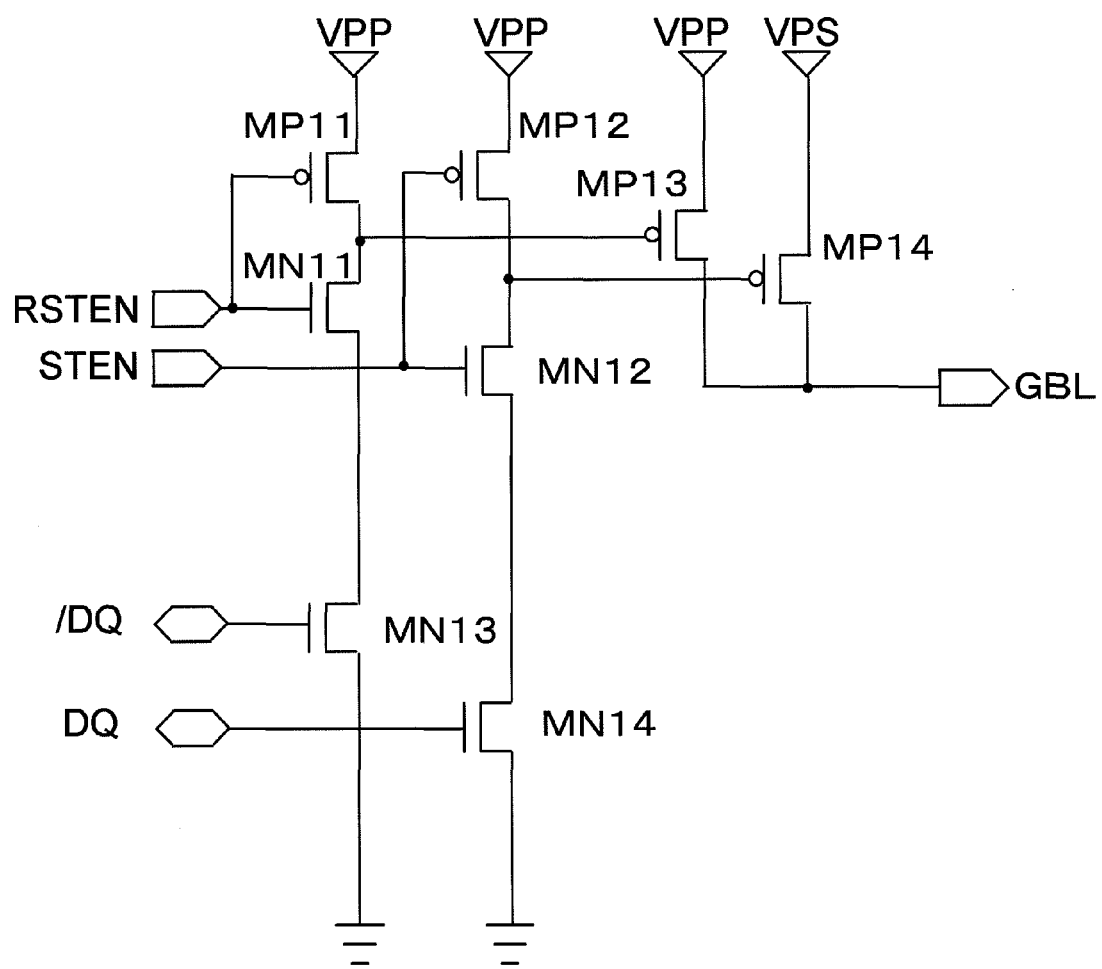
FIG. 5 is a circuit diagram of an example of a write driver circuit.

An example of the write driver circuit 22 is shown in FIG. 5. The write driver circuit 22 is provided with NMOS transistors MN11 to MN14 and PMOS transistors MP11 to MP14. The NMOS transistor MN11 has a drain connected to a drain of the PMOS transistor MP11 and a gate of the PMOS transistor MP13, a source connected to a drain of the NMOS transistor MN13, and a gate that is given a reset signal RSTEN. The NMOS transistor MN12 has a drain connected to a drain of the PMOS transistor MP12 and a gate of the PMOS transistor MP14, a source connected to a drain of the NMOS transistor MN14, and a gate that is given a set signal STEN. The NMOS transistor MN13 has a source connected to ground, and a gate that is given a signal /DQ. The NMOS transistor MN14 has a source connected to ground, and a gate that is given a signal DQ. The PMOS transistor MP11 has a source connected to VPP, and a gate that is given a reset signal RSTEN. The PMOS transistor MP12 has a source connected to VPP, and a gate that is given a set signal STEN. The PMOS transistor MP13 has a source connected to VPP, a gate connected to a drain of the NMOS transistor MN11, and a drain connected to the global bit line GBL. The PMOS transistor MP14 has a source connected to VPS, a gate connected to a drain of the NMOS transistor MN12, and a drain connected to the global bit line GBL.

Regarding the write driver circuit 22 having this type of configuration, when the phase change element RP to be selected is in a reset state (corresponding to /DQ: H), the reset signal RSTEN is H, the set signal STEN is L, the PMOS transistor MP13 is ON, the PMOS transistor MP14 is OFF, and VPP is supplied to the global bit line GBL. On the other hand, when the phase change element RP is in a set state (corresponding to DQ: H), the set signal STEN is H, the reset signal RSTEN is L, the PMOS transistor MP14 is ON, the PMOS transistor MP13 is OFF, and VPS is supplied to the global bit line GBL. That is, the configuration is such that when the phase change element RP is in a reset state, VPP, which is a high voltage, is supplied, and when the phase change element RP is in a set state, VPS, which is a lower voltage, is supplied. Furthermore, respective supply times (periods of time, pulse widths) of VPP and VPS correspond to activation times of the reset signal RSTEN and the set signal STEN.

Figure 6:
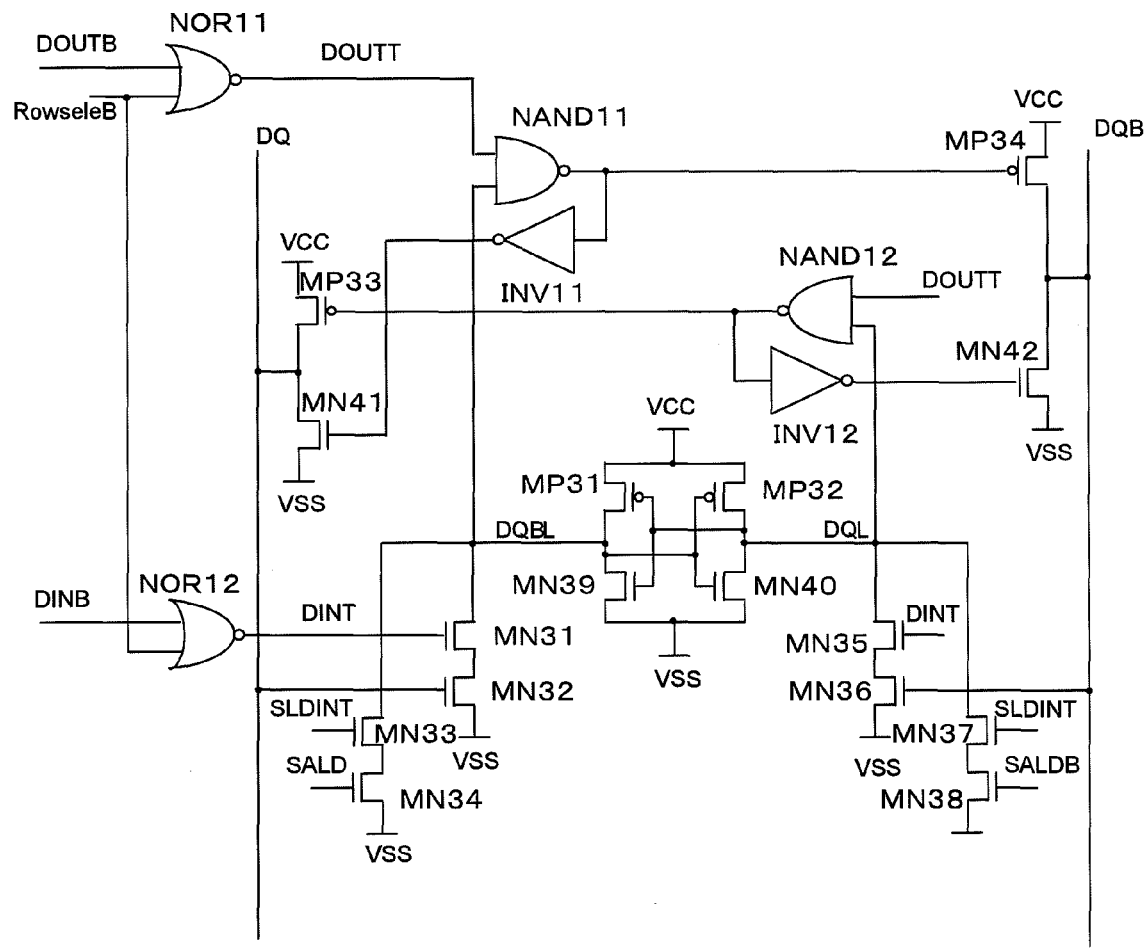
FIG. 6 is a circuit diagram of an example of a write-read latch circuit.

An example of the write-read latch circuit 23 is shown in FIG. 6. The write-read latch circuit 23 is provided with NMOS transistors MN31 to MN42, PMOS transistors MP31 to MP34, inverter circuits INV11 and INV12, NOR circuits NOR11 and NOR12, and NAND circuits NAND11 and NAND12.

The NOR circuit NOR11 receives signals DOUTB and RowseleB as input, and outputs a signal DOUTT to a first input end of each of the NAND circuits NAND11 and NAND 12. The NOR circuit NOR12 receives signals DINB and RowseleB as input, and outputs a signal DINT to a gate of the NMOS transistors MN31 and MN35. The NMOS transistor MN32 has a source connected to VSS, a drain connected to a source of the NMOS transistor MN31, and a gate that is given a signal DQ. The NMOS transistor MN34 has a source connected to ground, a drain connected to a source of the NMOS transistor MN33, and a gate that is given a signal SALD. The NMOS transistor MN33 has a gate that is given a signal SLDINT, and a drain that is connected to a drain of the NMOS transistor MN31, in addition to a second input end of the NAND circuit NAND11, and to a first input-output end of a latch circuit formed of PMOS transistors MP31 and MP32 and NMOS transistors MN39 and MN40.

Output of the NAND circuit NAND11 is connected to a gate of the PMOS transistor MP34 and a gate of the NMOS transistor MN41 via an inverter circuit INV11. The PMOS transistor MP33 has a source connected to a power supply VCC, a drain connected to a drain of the NMOS transistor MN41, and a gate connected to output of the NAND circuit NAND 12. The NMOS transistor MN41 has a source connected to VSS, and outputs a signal DQ from a drain.

The NMOS transistor MN36 has a source connected to VSS, a drain connected to a source of the NMOS transistor MN35, and a gate that is given a signal DQB. The NMOS transistor MN38 has a source connected to ground, a drain connected to a source of the NMOS transistor MN37, and a gate that is given a signal SALDB. The NMOS transistor MN37 has a gate that is given a signal SLDINT, a drain that is connected to a drain of the NMOS transistor MN35, in addition to a second input end of the NAND circuit NAND 12 and a second input-output end of the latch circuit.

Output of the NAND circuit NAND12 is connected to a gate of the PMOS transistor MP33 and a gate of the NMOS transistor MN42 via the inverter circuit INV12. The PMOS transistor MP34 has a source connected to the power supply VCC, a drain connected to a drain of the NMOS transistor MN42, and a gate connected to output of the NAND circuit NAND 11. The NMOS transistor MN42 has a source connected to VSS, and outputs a signal DQB from a drain.

The PMOS transistors MP31 and MP32, which have a source connected in common to the power supply VCC, form an inverter with the NMOS transistors MN39 and MN40, each having a source connected in common to VSS, and the inverter input and output is inter-connected to form a latch circuit. A signal DQBL from a first input-output end of the latch circuit is outputted, and a signal DQL is outputted from a second input-output end.

With regard to the write-read latch circuit 23 with this type of configuration, when there are signals SLDINT: H and RowSELEB: L, obtained by respectively decoding a part of the row address signal Xad, to be in an activated state (selection state), signals SALD and SALDB, being complementary data read from the sense amplifier circuit 21, are latched as signals DQL and DQBL by the latch circuit. When in a read mode, the signals become DOUTB: L and DINB: H, and in response to this, the latched data is read respectively as signals DQ and DQB.

On the other hand, when in a write mode, signals are as in DOUTB: H and DINB: L, and the signals DQ and DQB are respectively over-written in the latch circuit. When in the write mode, the write driver circuit 22 writes data to the phase change element RP, and also rewrites data of the write-read latch circuit 23. By operating in this way, in a case where a read mode occurs subsequent to a write mode, it is possible to read data from the write-read latch circuit 23 without again accessing the phase change element RP.

Figure 7:
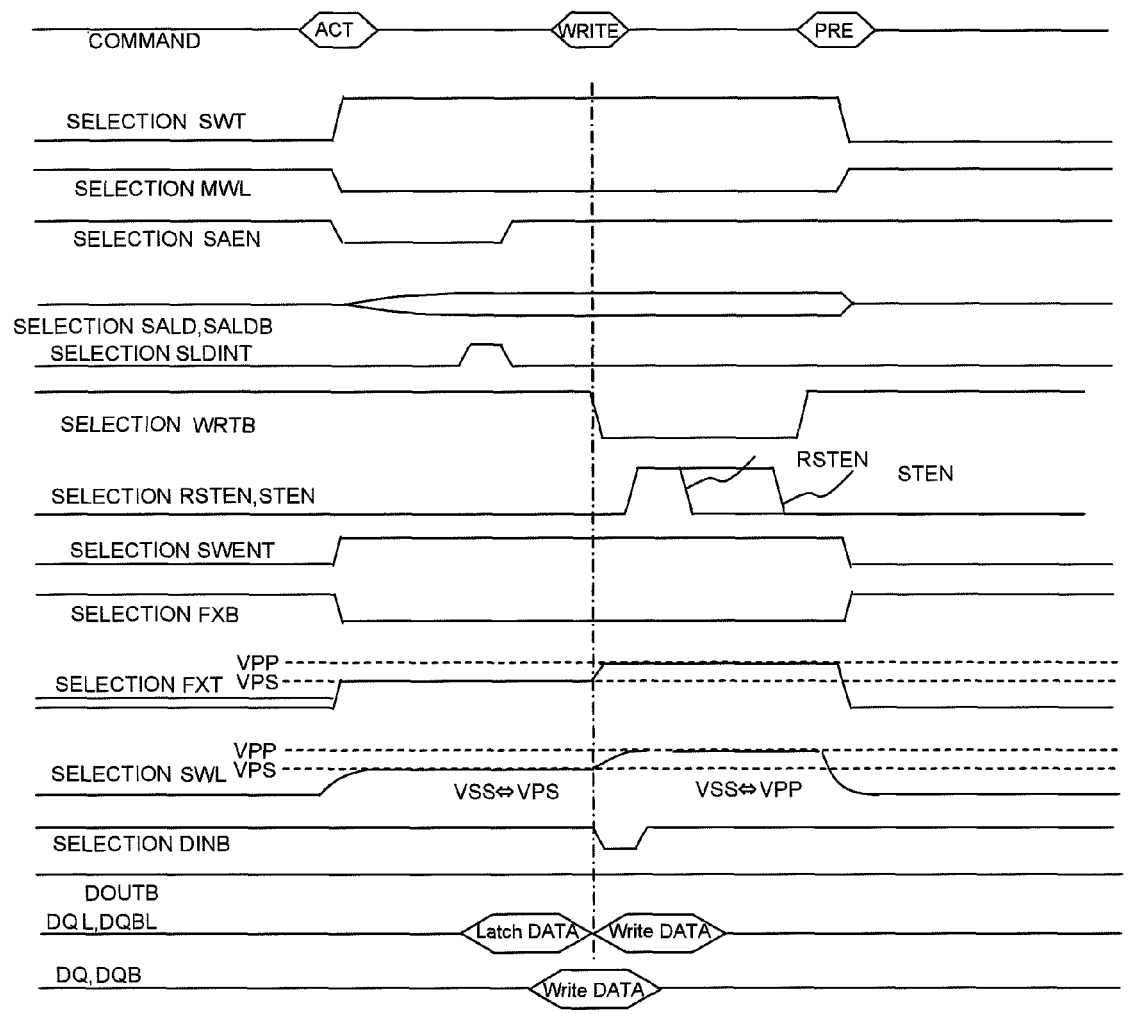
FIG. 7 is a timing chart representing an example of operation of each part with regard to a write mode of the semiconductor memory device according to an exemplary embodiment of the present invention.
Figure 8:
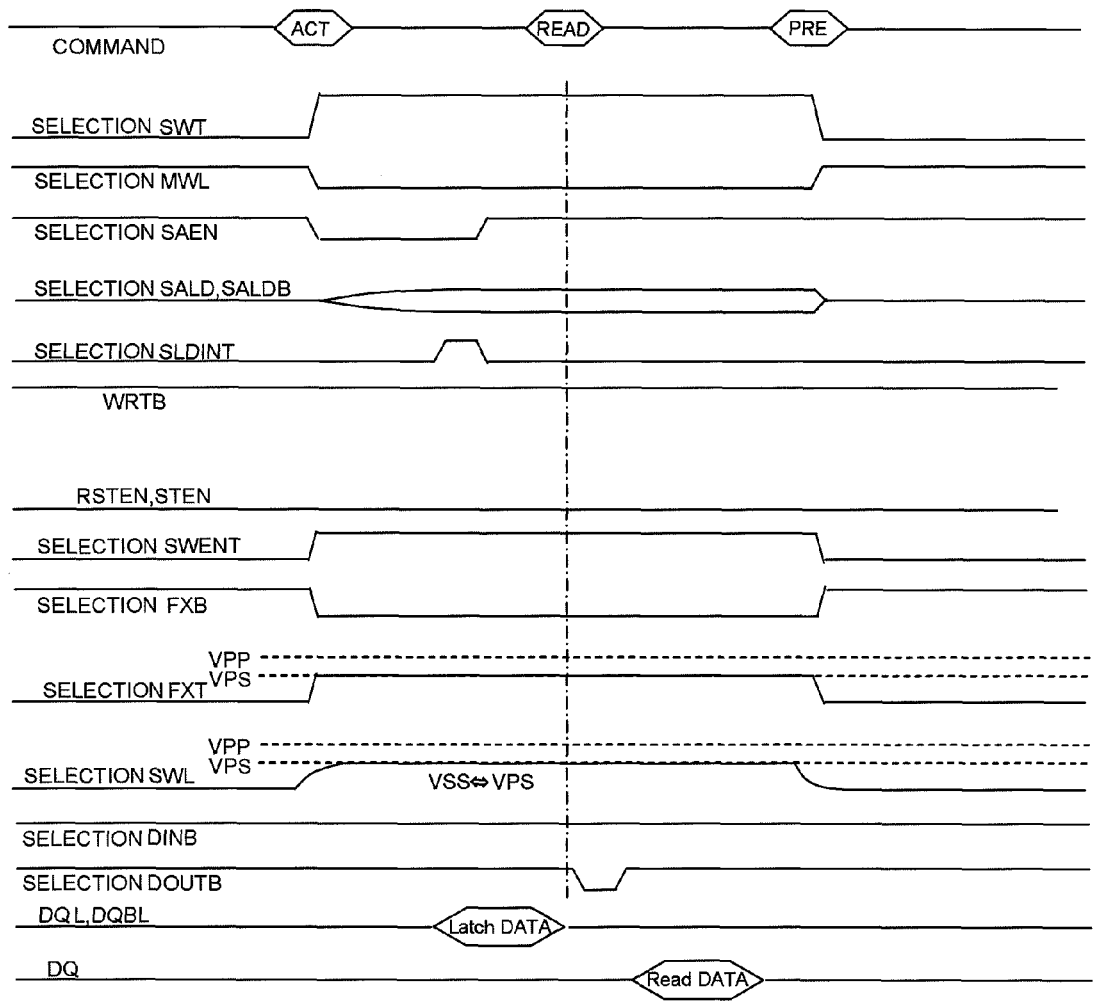
FIG. 8 is a timing chart representing an example of operation of each part with regard to a read mode of the semiconductor memory device according to an exemplary embodiment of the present invention.

Next, making reference to FIGS. 7 and 8, a description is given concerning read-write operation of the semiconductor memory device focusing on main parts. Here, a signal expressed as "selection . . . " indicates a "signal . . . " that is to be selected, among a plurality of signals.

FIG. 7 is a timing chart representing operation of each part in a write mode of the semiconductor memory device. First, when the row address signal Xad is received from an address terminal together with an ACT command, a sub-word line (selection SWL) selected by the row address signal Xad is activated, and potential of the sub-word line increases. This potential becomes VPS according to the level shift circuit (level changer) 13. A plurality of the phase change elements RPs are activated by one selection SWL, one among them is selected by the switch unit SWTBLK, and data is read by the sense amplifier circuit 21 and is held as latch data in the write-read latch circuit 23.

Next, when the column address signal Yad from an address terminal and data DQ from a data input-output terminal are received together with a WRITE command, a signal in accordance with H/L of the data DQ from the write driver circuit 22 is supplied to the global bit line GBL, for a time-period according to pulse widths of the reset signal RSTEN (selection RSTEN) and the set signal STEN (selection STEN), and is written to the phase change element RP that is to be selected. In this case, since a large current amount is required in the write mode, in comparison with the read mode, the potential of the sub-word line SWL selected is further increased from VPS to become VPP (Vgs of the memory cell transistor MN0 is increased). As a result, data is written to the selected phase change element RP. Furthermore, as described above, the same data is over-written with regard to data latched by the write-read latch circuit 23. Thereafter, when a PRE command to return the semiconductor memory device to an idle (IDLE) state is inputted, each control signal goes into a standby state.

FIG. 8 is a timing chart representing operation of each part in a read mode of the semiconductor memory device. In the read mode, until a READ command arrives, the timing chart is the same as the operation timing chart of each part in the write mode, and with regard to a control electrode of the memory cell transistor MN0, stepping-up of VSS→VPS is performed. By the potential of VPS being supplied to the control electrode of the memory cell transistor MN0, data can be read at the sense amplifier circuit 21. Similar to the write mode, a standby mode is entered by the PRE command.

Figure 9:
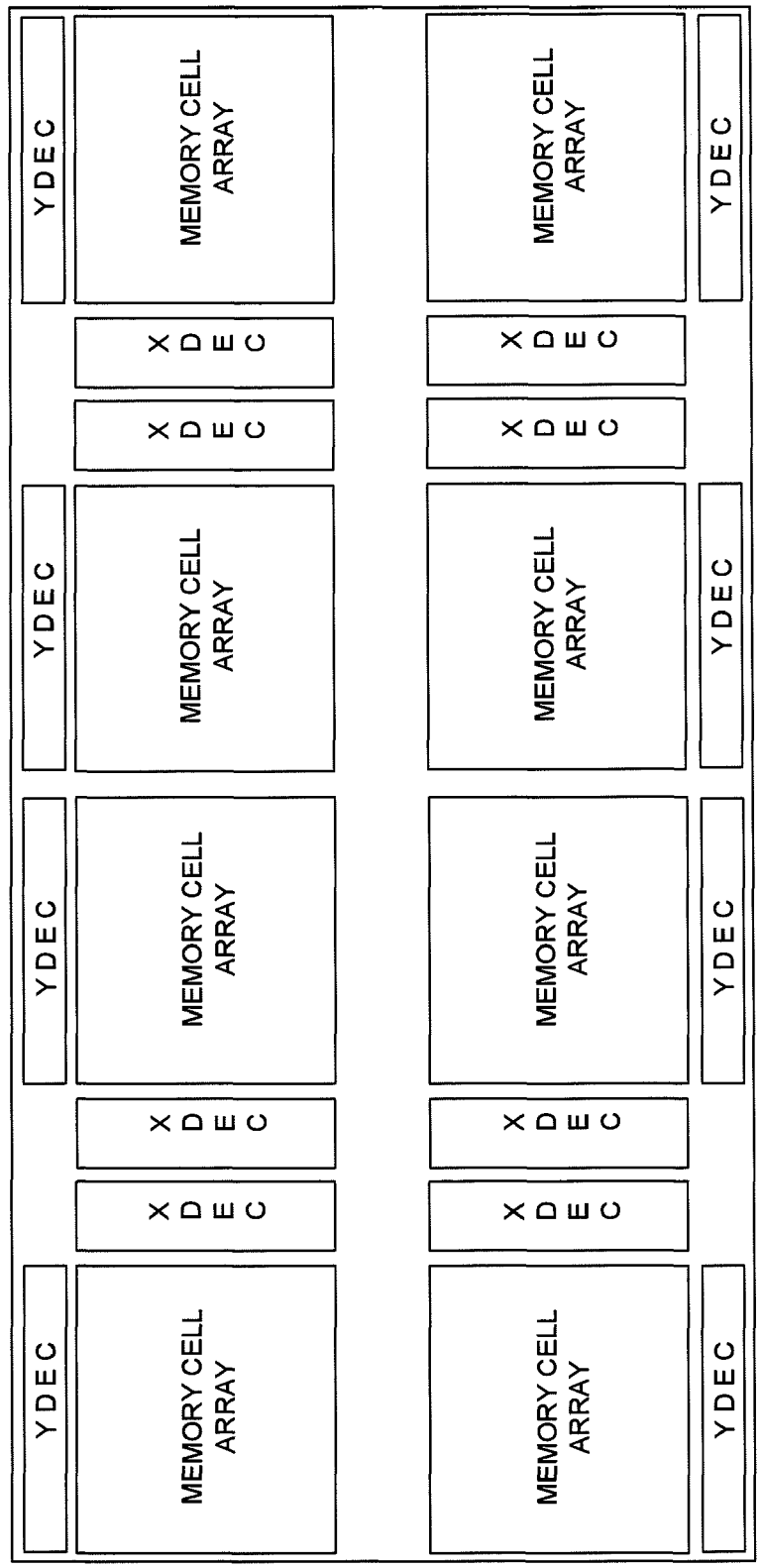
FIG. 9 is a drawing showing a configuration of the semiconductor memory device according to an exemplary embodiment of the present invention.
Figure 10:
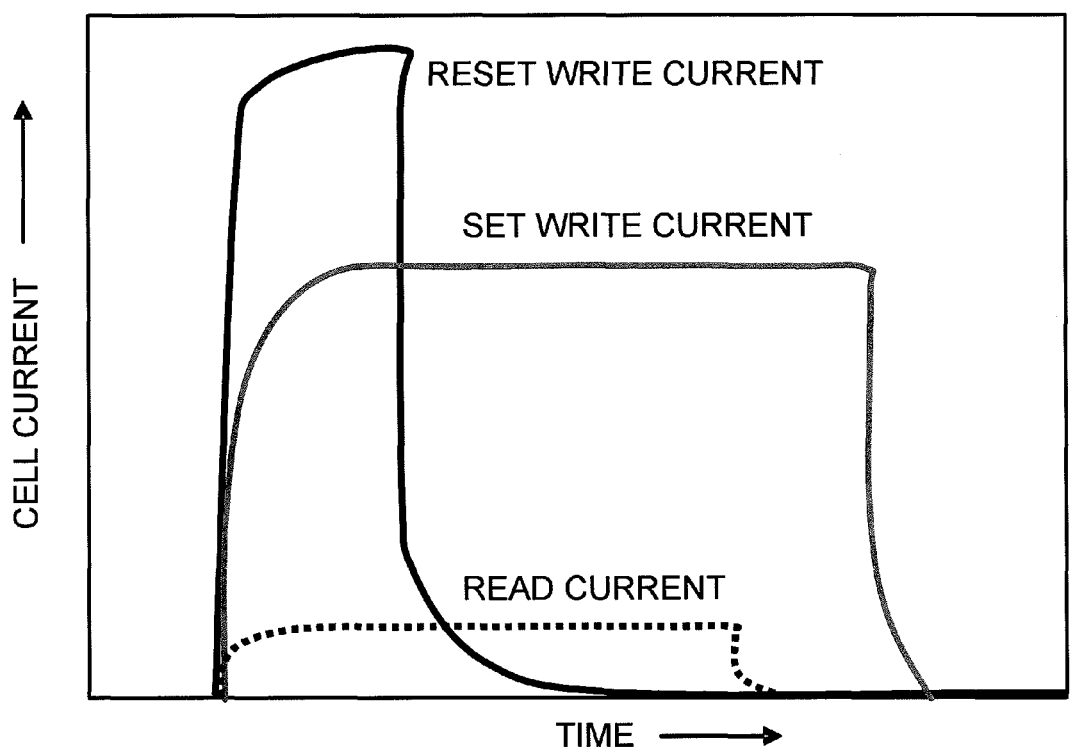
FIG. 10 is a drawing showing an operating current when writing to and reading from a phase change memory.

FIG. 9 is an overall diagram of the semiconductor memory device according to the exemplary embodiment of the present invention. The circuit configuration shown in FIG. 1 corresponds to a part surrounded by YDEC and XDEC in FIG. 9. In FIGS. 7 and 8, a description has been given focusing on a timing chart related to one item of data, but when there is an actual ACT command, a plurality of selection SWLs transition from VSS to VPS (for example, 512 of the selection SWLs), and in a subsequent WRITE time, a number of selection SWLs, which is fewer than this (for example, 1), transition from VPS to VPP. In this way, by controlling the potential of the selection SWL in accordance with an address actually written, it is possible to further decrease the consumed current in comparison to a case of controlling the potential of all the selection SWLs at a write time.

In the abovementioned description, VPS is dually used for a set voltage at write time, and a control electrode voltage of the memory cell transistor MN0 at read time. However, at read time, if there is no problem in reading by the sense amplifier circuit 21, a control electrode voltage of the memory cell transistor MN0 at read time may use VCC or the like, which is the power supply of the semiconductor memory device, not VPS. By using VCC, it is possible to further reduce wasted current consumption in the VPS generator 11.

Furthermore, here, the VPS generator 11 and the VPP generator 12 are taken as step-up power supply circuits, but these can take any form of step-up power supply circuit or step-down power supply circuit, according to potential of an external power supply.

According to the present invention, there are various possible modes as set forth below.

(Mode 1) As aforementioned as the second aspect.
(Mode 2) It is preferred that the word line control circuit supplying the word line with the third voltage after supplying the word line with the second voltage in series in a write operation mode and the word line control circuit supplying the word line with the second voltage without supplying the word line with the third voltage in a read operation mode.
(Mode 3) It is preferred that the memory cell of the memory cell unit is a resistance change type memory, the resistance change type memory becoming a set state by consuming the second voltage, and the resistance change type memory becoming a reset state by consuming the third voltage, the memory cell in the set state is smaller in resistance than that in the reset state.
(Mode 4) It is preferred that the word line control circuit includes a level changer which has a first switch coupled to the first voltage generator and a second switch coupled to the second voltage generator, the first switch becoming closed and the second switch becoming opened in the read operation mode, the first switch becoming opened and the second switch becoming closed in the write operation mode.
(Mode 5) The method as aforementioned as the third aspect.
(Mode 6) The method according to mode 5, wherein the supplying may be a supplying in a write operation mode, the method may further comprise: supplying the word line with the second voltage and then not supplying the word line with the third voltage in series in a read operation mode.
(Mode 7) The method according to mode 6, wherein the supplying the word line with the second voltage may be performed in response to an active command in the write operation mode and the supplying the word line with the third voltage may be performed in response to a write command in the write operation mode.

It is to be noted that each disclosure of the above-mentioned patent documents and the like are incorporated herein by reference. Modifications and adjustments of exemplary embodiments and examples are possible within the bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that a person skilled in the art can realize according to technological concepts and the entire disclosure including the scope of the claims.

What is claimed is:

1. A semiconductor device comprising:
   a first voltage generator supplied with a first voltage, pumping the first voltage to generate a second voltage;
   a second voltage generator supplied with the first voltage, pumping the first voltage to generate a third voltage that is larger than the second voltage, and the second voltage generator being larger in number of pumping than the first voltage generator;
   a word line;
   a memory cell unit including a memory cell transistor of which a control electrode is connected to the word line and a memory cell coupled to the memory cell transistor; and
   a word line control circuit coupled to the first and second voltage generators and the word line, the word line control circuit supplying the word line with the third voltage after supplying the word line with the second voltage in series.

2. The semiconductor device according to claim 1, wherein the word line control circuit supplying the word line with the third voltage after supplying the word line with the second voltage in series in a write operation mode and the word line control circuit supplying the word line with the second voltage without supplying the word line with the third voltage in a read operation mode.

3. The semiconductor device according to claim 2, wherein the memory cell of the memory cell unit is a resistance change type memory, the resistance change type memory becoming a set state by consuming the second voltage, and the resistance change type memory becoming a reset state by consuming the third voltage, the memory cell in the set state is smaller in resistance than that in the reset state.

4. The semiconductor device according to claim 1, wherein the word line control circuit includes a level changer which has a first switch coupled to the first voltage generator and a second switch coupled to the second voltage generator, the first switch becoming closed and the second switch becoming opened in the read operation mode, the first switch becoming opened and the second switch becoming closed in the write operation mode.

5. A method comprising:
pumping a first voltage to generate a second voltage larger in absolute value than the first voltage;
pumping the first voltage to generate a third voltage larger in absolute value than the second voltage;
supplying a word line with the second voltage, and then supplying the word line with the third voltage in series.

6. The method according to claim 5, wherein the supplying is a supplying in a write operation mode, the method further comprising:
supplying the word line with the second voltage and then not supplying the word line with the third voltage in series in a read operation mode.

7. The method according to claim 6, wherein the supplying the word line with the second voltage is performed in response to an active command in the write operation mode and the supplying the word line with the third voltage is performed in response to a write command in the write operation mode.

* * * * *